(12) United States Patent
Goulet et al.

(10) Patent No.: US 12,111,366 B2
(45) Date of Patent: Oct. 8, 2024

(54) LAMP MANUFACTURING PROCESS

(71) Applicant: LLINK TECHNOLOGIES, L.L.C., Brown City, MI (US)

(72) Inventors: Jeff Goulet, Dryden, MI (US); Lisa Spencer-Conn, Mussey, MI (US)

(73) Assignee: Llink Technologies, L.L.C., Brown City, MI (US)

( * ) Notice: Subject to any disclaimer, the term of this patent is extended or adjusted under 35 U.S.C. 154(b) by 12 days.

(21) Appl. No.: 17/791,292

(22) PCT Filed: Jan. 7, 2021

(86) PCT No.: PCT/US2021/012487
§ 371 (c)(1),
(2) Date: Jul. 7, 2022

(87) PCT Pub. No.: WO2021/142111
PCT Pub. Date: Jul. 15, 2021

(65) Prior Publication Data
US 2023/0349985 A1 Nov. 2, 2023

Related U.S. Application Data

(60) Provisional application No. 62/957,877, filed on Jan. 7, 2020.

(51) Int. Cl.
G01R 31/44 (2020.01)
B60Q 1/04 (2006.01)
B60Q 1/26 (2006.01)
G01R 31/26 (2020.01)

(52) U.S. Cl.
CPC .............. *G01R 31/44* (2013.01); *B60Q 1/04* (2013.01); *B60Q 1/26* (2013.01); *G01R 31/2635* (2013.01); *B60Q 2900/20* (2013.01)

(58) Field of Classification Search
CPC .... G60Q 10/30; G01R 31/44; G01R 31/2635; G01R 31/26; B60Q 1/04; B60Q 1/26
See application file for complete search history.

(56) References Cited

U.S. PATENT DOCUMENTS 3,646,438 A 2/1972 Staff
6,106,648 A 8/2000 Butt
(Continued)

FOREIGN PATENT DOCUMENTS

CN 102478641 A 5/2012
CN 102478643 A 5/2012
(Continued)

OTHER PUBLICATIONS

ClubLexus (https://www.clublexus.com/forums/gs-3rd-gen-2006-2011/670704-diy-how-to-take-apart-headlights-for-installation-of-accesories-and-removal-of-parts.html) (Year: 2015).*
(Continued)

*Primary Examiner* — Tracie Y Green
*Assistant Examiner* — Michael Chiang
(74) *Attorney, Agent, or Firm* — The Dobrusin Law Firm, P.C.; Daniela M. Thompson-Walters

(57) ABSTRACT

The present teachings relate to a method for identifying reusable components of a vehicle lamp assembly, the method including: i) performing an electric circuit functionality test on each component of a plurality of components of the vehicle lamp assembly; ii) performing an illumination test on each light source within the vehicle lamp assembly; iii) identifying which of the components of the plurality of components pass and/or fail the electric circuit functionality test; and iv) identifying which light sources pass and/or fail the illumination test.

20 Claims, 7 Drawing Sheets

(56) References Cited

U.S. PATENT DOCUMENTS

| | | | |
|---|---|---|---|
| 7,652,480 B2 | 1/2010 | Mollet | |
| 9,965,742 B1* | 5/2018 | Marlow | G06Q 10/087 |
| 10,086,782 B1* | 10/2018 | Konrardy | G06F 16/2455 |
| 2005/0242822 A1* | 11/2005 | Klinger | H05B 45/50 |
| | | | 340/664 |
| 2006/0181889 A1* | 8/2006 | Toda | H05B 45/10 |
| | | | 362/459 |
| 2008/0023872 A1* | 1/2008 | Criel | B29C 49/4205 |
| | | | 425/534 |
| 2013/0121013 A1* | 5/2013 | Shibata | B60Q 1/076 |
| | | | 362/523 |
| 2013/0221973 A1* | 8/2013 | Whisenand | G01R 31/52 |
| | | | 324/501 |
| 2017/0131345 A1 | 5/2017 | Koellner et al. | |
| 2018/0043821 A1 | 2/2018 | Dixon et al. | |

FOREIGN PATENT DOCUMENTS

| | | | |
|---|---|---|---|
| CN | 103424718 A | * | 12/2013 |
| CN | 104880677 A | | 9/2015 |

OTHER PUBLICATIONS

Cai et al., Multi-lamp on-line automatic integrated test system and method, 2015, Espacenet, https://worldwide.espacenet.com/patent/search/family/049649744/publication/CN103424718A?q=pn%3DCN103424718A (Year: 2015).*

RX8Club (https://www.rx8club.com/series-ii-diy-161/diy-open-headlights-taillights-213651/) (Year: 2015).*

International Search Report and Written Opinion for Application No. PCT/US2021/012487 mailed Mar. 30, 2021.

Transmittal of International Preliminary Report on Patentability for Application No. PCT/US2021/012487 mailed Dec. 1, 2021.

ClubLexus, https://www.clublexus.com/forums/gs-3rd-gen-2006-2011/670704-diy-how-to-take-apart-headlights-for-installation-of-accessories-and-removal-of-parts.html, May 13, 2016.

RX8Club, https://www.rx8club.com/series-ii-diy-161/diy-open-headlights-taillaights-213651/; Sep. 10, 2015.

Supplementary European Search Report mailed Nov. 29, 2023, EP Application 21738467.

* cited by examiner

| Headlamp Unit | Voltage (Volts) | Resistance (Ohms) | LED 1 (Lumens) | LED 2 (Lumens) |
|---|---|---|---|---|
| 1 | | | | <u>502</u> |
| 2 | | <u>502</u> | | |
| 3 | | | | |
| 4 | | | <u>502</u> | |

LAMP MANUFACTURING PROCESS

FIELD

The present teachings relate to a process for manufacturing vehicle lamps using one or more salvaged components. The present teachings may be particularly useful relative to vehicle headlamps. The present teachings may be particularly beneficial in identifying which components of a vehicle lamp may be salvaged for subsequent use.

BACKGROUND

Vehicle lamp technology for vehicles has continued to improve over the years. These improvements have resulted in vehicle lamps (e.g., headlamps, taillamps, fog lamps, etc.) with better lighting, including halogen lights, xenon lights, light emitting diodes (LED) lights. Xenon and LED lights allow for a significantly greater efficiency and longevity. In addition to the advances in illumination, dynamic vehicle lamps (e.g., headlamps) are becoming common in the market with functions like high beam assist. In addition to lighting improvements for efficiency and longevity, adaptive vehicle lamps are gaining popularity. Adaptive vehicle lamps dynamically adapt to road curvature, turns, darkness, and even precipitation or moisture to maintain a standard level of brightness on the path of the vehicle. While all these advances provide significant improvements in vehicle safety, the improvements also result in significant increased costs with respect to vehicle lamp components and manufacturing.

With the increased complexity in vehicle lamps, component replacement by a consumer has become increasingly difficult and at times impossible. Tighter engine compartment access may prevent a consumer from being able to access a bulb, harness, or both for replacement. If failure is beyond just replacement of a light, consumers or vehicle repair centers may struggle to or even be unable to determine which component has failed and needs replacement. At times, even when the failed component has been identified, consumers may be unable to purchase a replacement component as many of the vehicle lamp components are not available for sale to the general public. In addition, to prevent moisture entry into newer vehicle lamp assemblies, the housings are usually sealed to the exterior lens by an adhesive. This adhesive seal may prevent consumers and even vehicle repair centers accessing the interior of the vehicle lamp assembly to repair or replace one or more internal components without significant damage to the assembly.

In addition to routine repairs by a consumer, vehicle lamps are also one of the more common components of a vehicle to be damaged. As headlamps are located at the front of a vehicle and taillamps are located at the rear, the headlamps and/or taillamps are often the first or one of the first components of the vehicle to be impacted during a crash or other incident. After a vehicle lamp is physically damaged, it can be difficult to identify which components are no longer useful and which may be reusable. As reusable components cannot be identified, typically, vehicle lamps damaged in an accident are disposed of in their entirety or with minimal re-use of components. These discarded components are generally disposed of into landfills as opposed to being sorted to determine which components of the headlamp can be recycled.

What is needed is a process for identifying exactly which components of a vehicle lamp are reusable within the same or a different lamp assembly. What is needed is a process for harvesting useful components from a lamp assembly while avoiding any or further damage to the lamp assembly. What is needed is a process for determining what components of a vehicle lamp assembly are able to be recycled, as opposed to thrown away, if the components are determined to be no longer useful. What is needed is a process for reusing salvaged components for assembling a vehicle lamp that meets or exceeds original specification standards required for a lamp assembly with all new components.

SUMMARY

The present disclosure relates to a method for identifying reusable components of a vehicle lamp assembly, the method comprising: i) performing an electric circuit functionality test on each component of a plurality of components of the vehicle lamp assembly; ii) performing an illumination test on each light within the vehicle lamp assembly; iii) automatically identifying which of the components of the plurality of components pass and/or fail the electric circuit functionality test; and iv) automatically identifying which lights pass and/or fail the illumination test.

The present disclosure relates to a method for identifying reusable components of a vehicle lamp assembly, the method comprising: i) performing an electric circuit functionality test on each component of a plurality of components of the vehicle lamp assembly; ii) performing an illumination test on each light within the vehicle lamp assembly; iii) automatically identifying which of the components of the plurality of components pass and/or fail the electric circuit functionality test; and iv) automatically identifying which lights pass and/or fail the illumination test; wherein during the electric functionality test, the illumination test, or both an electrical current is automatically passed through each component of the plurality of components; and wherein the electrical circuit functionality test is performed on each component of the plurality of components by passing the electrical current through each individual circuit associated with each individual component.

The present disclosure further relates to a method for opening a lamp assembly comprising: i) cutting about an adhesive joint between an exterior lens and a housing; and ii) separating the exterior lens from the housing to expose an interior of the lamp assembly. The lamp assembly may have one or more components, light sources, or both which are identified as passing using a method according to the present teachings.

The present disclosure further relates to a method of assembling a remanufactured lamp assembly, the method comprising: i) assembly one or more components previously part of another lamp assembly into a housing of the remanufactured lamp assembly, wherein the one or more components passed an electrical circuit functionality test, illumination test, or both; ii) performing a functionality test on the one or more components; iii) affixing an exterior lens to the housing to form the remanufactured lamp assembly. The lamp assembly may have one or more components, light sources, or both which are identified as passing using a method according to the present teachings, one or more components, light sources, or both removed according to the present teachings, or both.

The present disclosure provides a salvage determination process. The salvage determination process may allow for one or more individual components within a lamp assembly to be identified as useful for continued or reuse. The present disclosure provides a salvaging process. The salvaging process may be particularly useful in salvaging one or more components identified as reusable while preventing additional damage to the lamp assembly. The salvage determination process and salvaging process may be customizable to accommodate a variety of lamp assembly designs and configurations. The salvage determination process may allow for a lamp assembly to be remanufactured using salvaged components and meets or even exceeds specifications required of lamp assemblies using all new components.

DETAILED DESCRIPTION

Figure 1:
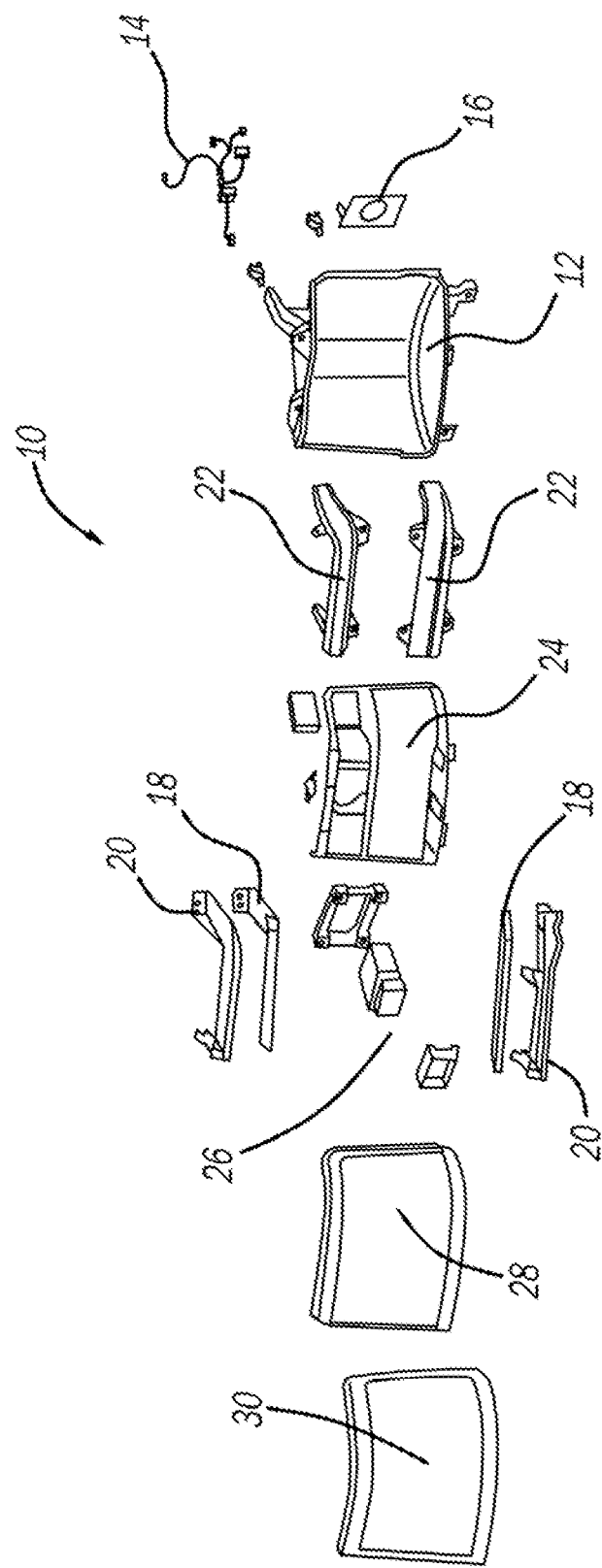
FIG. 1 is an exploded view of a lamp assembly.
Figure 2A:
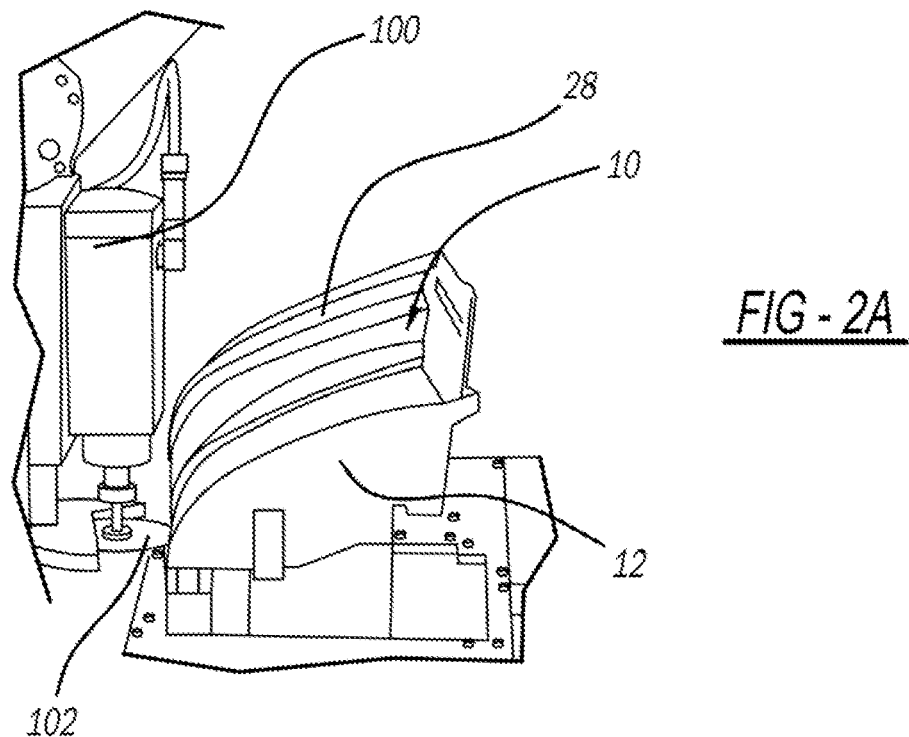
FIG. 2A illustrates cutting of a lamp assembly.
Figure 2B:
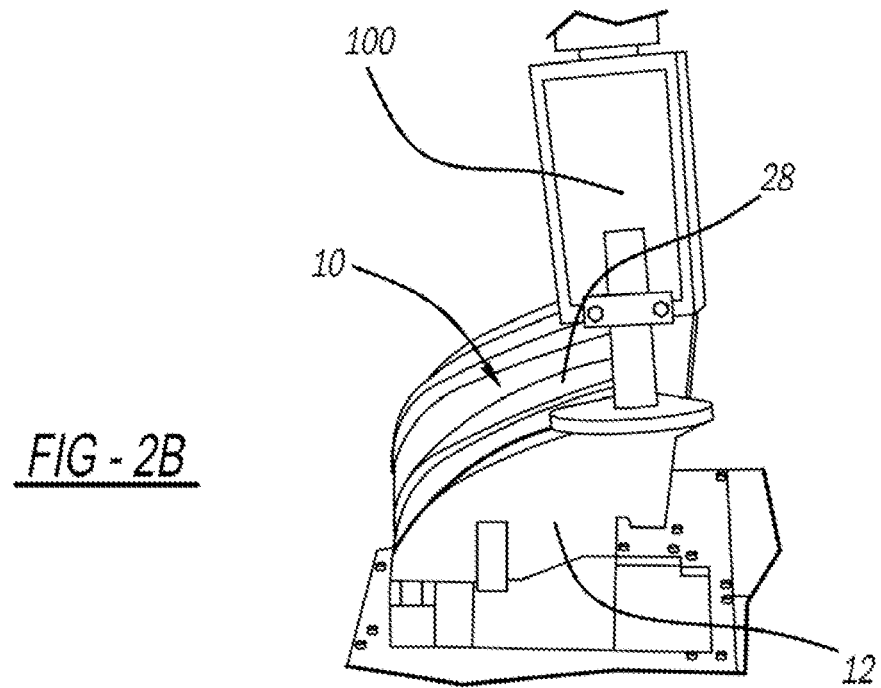
FIG. 2B illustrates cutting of a lamp assembly.
Figure 2C:
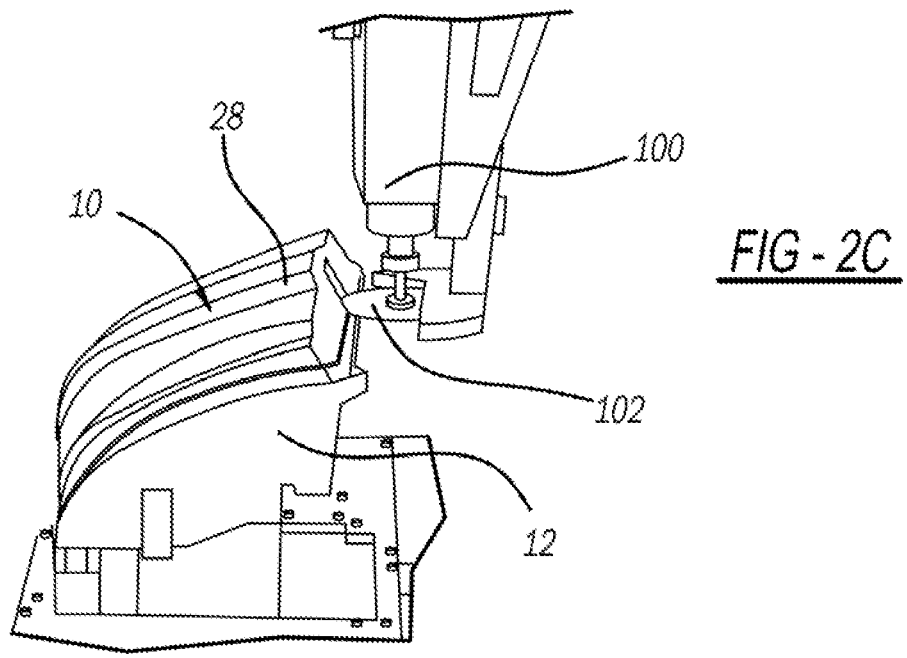
FIG. 2C illustrates cutting of a lamp assembly.
Figure 2D:
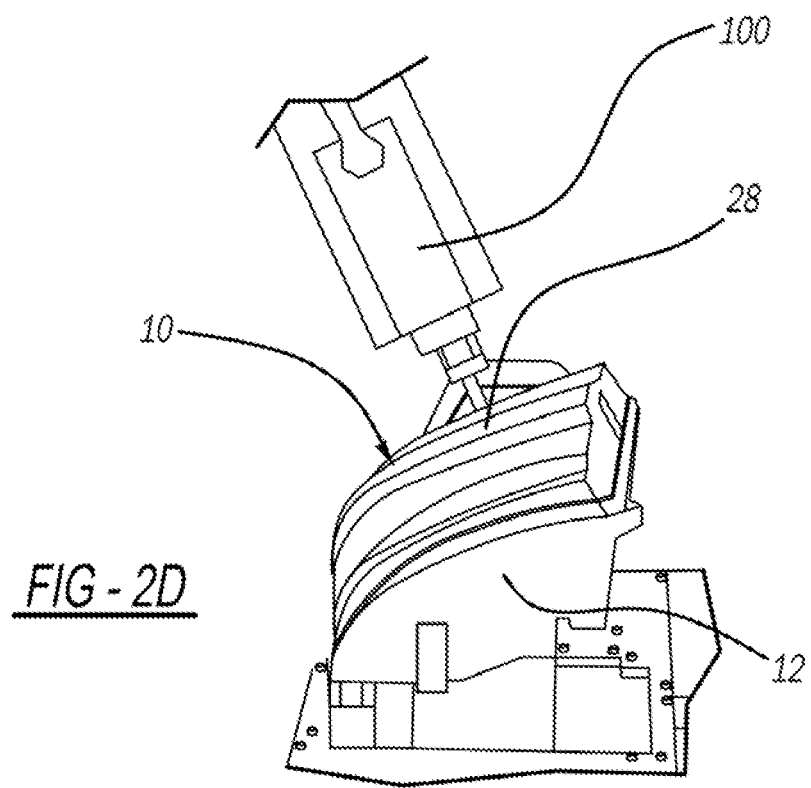
FIG. 2D illustrates cutting of a lamp assembly.

The present teachings meet one or more of the above needs by the improved devices and methods described herein. The explanations and illustrations presented herein are intended to acquaint others skilled in the art with the teachings, its principles, and its practical application. Those skilled in the art may adapt and apply the teachings in its numerous forms, as may be best suited to the requirements of a particular use. Accordingly, the specific embodiments of the present teachings as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

Lamp Assembly

The present teachings relate to a lamp assembly. The lamp assembly may refer to an original lamp assembly, remanufactured lamp assembly, or both. An original lamp assembly may refer to a lamp assembly having all original components (e.g., not used in a lamp assembly before). A remanufactured lamp may refer to a lamp assembly have one or more previously used components. The lamp assembly may be a vehicle lamp assembly. A vehicle lamp assembly may include one or more lamps as part of an exterior, interior, or both of the vehicle. A vehicle lamp assembly may include one or more lamps which illuminate a vehicle, a path of the vehicle, or both. A vehicle may include a car, truck, bus, train, airplane, motorcycle, or the like. The lamp assembly may be one or more headlamp assemblies, taillamp assemblies, the like, or a combination thereof. The lamp assembly may include one or more components. The lamp assembly may have one or more components which are salvaged, may be assembled out of one or more salvaged components, or both. The one or more components may be located within a housing.

The lamp assembly includes a housing. The housing functions to house, provide structural support, and/or protect one or more components of the lamp assembly. The housing may have a shape substantially reciprocal with a lamp pocket of a vehicle. The housing may have a hollow interior for housing the one or more components. The housing may be made from one or more polymeric materials. The one or more polymeric materials may include polypropylene, polybutylene terephthalate, polycarbonate-acrylonitrile butadiene styrene (PCABS), the like, or a combination thereof. The housing may include a rim. The rim may be formed as an edge, flange, channel, the like, or a combination thereof. The rim may be located about the hollow interior. The rim may have an adhesive applied thereon. The housing may be adhered to an exterior lens to form the lamp assembly. The adhesive applied about the rim may allow the rim to mate with and adhere to an exterior lens.

The lamp assembly includes an exterior lens. The exterior lens functions to house and/or protect one or more components of the lamp assembly, direct a light path from one or more light sources, or a combination thereof. The exterior lens functions to allow light output from one or more lights, reflectors, and/or projectors to pass therethrough. The exterior lens is substantially transparent. The transparency allows for the light output to pass therethrough. The exterior lens may be comprised of one or more materials. The one or more materials are suitable for location at an exterior of a vehicle. The one or more materials may withstand exposure to sun, heat, snow, cold, precipitation, and the like without damaging the transparent properties of the lens (e.g., avoid yellowing over time). The one or more materials may include one or more polymers. The one or more polymers may include polycarbonate, polypropylene, polyethylene, acrylic, the like, or a combination thereof. The exterior lens may include a rim. The rim of the exterior lens may be formed as an edge, flange, channel, the like, or a combination thereof. The rim of the exterior lens may have a shape substantially reciprocal to that of the rim of the housing. The rim may be affixed to the housing via one or more attachment methods. For example, the rim may have an adhesive applied thereon.

The lamp assembly may be held together via one or more attachment methods. The one or more attachment methods may function to adhere and/or mate one or more components to another semi-permanently, permanently, or both. One or more attachment methods may function to adhere and/or affix an exterior lens to a housing. The one or more attachment methods may include one or more adhesive materials, mechanical fasteners, bonding methods, the like, or any combination thereof. One or more bonding methods may include welding. Welding may include any type of welding suitable for welding of plastic materials. Exemplary welding techniques may include sonic welding, vibration welding, radiofrequency welding, friction welding, laser welding, One or more bonding methods may include sonic welding, vibration welding, electromagnetic welding, solvent welding, hot plate welding, contact welding, the like, or any combination thereof. One or more mechanical fasteners may include one or more threaded fasteners, clips, staples, friction-fit, interference-fit, the like, or any combination thereof. The one or more adhesive materials (e.g., adhesives) may be a reactive system, non-reactive system, or both. One or more reactive systems may include 1-part adhesives, 2-part adhesives, hot melt adhesives, the like, or a combination thereof.

The one or more adhesives may comprise silicone, polyurethane, butyl rubber, the like, or a combination thereof. One or more accelerators may be utilized to expedite curing of the one or more adhesives. One or more adhesives may be applied manually, robotically, or both. One or more fixing aids, such as clamps, may be used to retain one or more components together during curing of the one or more adhesives. The one or more adhesives may be applied to a housing, exterior lens, other components, the like, or a combination thereof. The one or more adhesives may be applied about one or more rims. The one or more adhesives may form a seal joint between a housing and an exterior lens, thus sealing in one or more components within the lamp assembly.

The lamp assembly includes one or more components. One or more components may function to provide illumination, transmit electrical current, adapt or change the illumination, product one or more beam patterns, retain one or more other components, the like, or a combination thereof. The one or more components may include one or more wire harnesses, electrical connectors, adjusters, light assemblies, light guides, lenses, projectors, reflectors, bezels, the like, or a combination thereof. The one or more wire harnesses may connect to the housing via one or more electrical connectors, one or more other components, or a combination thereof. The one or more wire harnesses may provide a path for an electrical current from a power source to each component. The wire harness may provide individual circuits to one or more components of the lamp assembly. The one or more light assemblies may provide illumination. The one or more light assemblies may include one or more light sources, optics, the like, or a combination thereof. The one or more light sources may include one or more halogen, xenon, light emitting diodes, the like, or a combination thereof. The one or more sources may have their light beams altered via one or more projectors, reflectors, or both.

Separation Device

The lamp assembly may be separated using a separation device. The separation device may function to separate one or more components from one or more other components of the lamp assembly. The separation device may function to separate one or more exterior components to expose one or more interior components with minimal damage. The separation device may function to separate a housing from an exterior lens. The separation device may be manual or automatic. The separation device may be programmed to follow a specific profile, contour, geometry, or the like about the lamp assembly. The separation device may be programmed to follow the general shape of one or more of a rim, housing, exterior lens, adhesive joint, the like, or a combination thereof. The separation device may be configured to cut to a depth which does not damage components within an interior of the lamp assembly. The separation device may only cut to a depth equal or greater than a thickness of a rim, housing, exterior lens, adhesive joint, the like, or a combination thereof. The separation device may avoid contact with one or more interior components while cutting. The separation device may include a robotic arm, cutting mechanism, or both. The separation device may include, be in communication with, and/or be controlled by one or more processors, storage mediums, or both. One or more storage mediums may store one or more programs of the separation device. One or more programs may include the one or more programs related to one or more different lamp assemblies, including different profiles, contours, geometries, and the like. One or more programs may be accessible by one or more processors. The one or more processors may control the separation device based on the one or more programs. The one or more processors, storage mediums, or both may be non-transient. The one or more processors, storage mediums, or both may allow for the separation device to automatically separate an exterior component from an interior component, a housing from a lens, or both.

The separation device may include a robotic arm. The robotic arm may allow for the separation device to move about the lamp assembly during cutting, move the location of the cutting mechanism relative to the lamp assembly, or both. The robotic arm may include one or more end effectors. The one or more end effectors may function to include a cutting mechanism, vacuum, or both.

The separation device may include a cutting mechanism. The cutting mechanism may function to cut through an exterior of a lamp assembly. The cutting mechanism may be any cutting mechanism capable of cooperating with a robotic arm. The cutting mechanism may be any cutting mechanism capable of cutting through one or more of the housing, exterior lens, adhesive, rims, or a combination thereof. The cutting device may include on or more saws, blades, lasers, water jets, routers, hot knifes, the like, or any combination thereof. The one or more saws may include one or more circular saws. The one or more cutting mechanisms may be utilized after performing a salvage determination process.

Salvage Determination Process

The present teachings relate to a salvage determination process. The salvage determination process may function to determine one or more components which may or may not be salvageable (e.g., able to be reused). The salvage determination process may function to determine the performance of one or more individual components of a lamp assembly. The salvage determination process may consist of an electric circuit functionality test, an illumination test, a visual inspection, the like, or a combination thereof. The salvage determination process may occur at a testing station. The salvage determination process may begin by a lamp assembly being placed in a testing station and connecting to a testing unit.

The testing station may include a testing unit, a lamp retainer, or both. The lamp retainer may be a fixture configured to retain one or more lamp assemblies. The testing unit may be configured to be placed in electrical communication with the lamp assembly. The testing unit may include one or more power sources. The one or more power sources may transmit electrical current to the lamp assembly. The testing unit may include one or more detection devices. The detection devise may be one or more sensing devices. The one or more detection devices may function to detect and/or measure one or more features of one or more currents. The one or more detection devices may include one or more devices which are adapted to detect and/or measure electrical current, electrical resistance, electrical voltage, light output, or a combination thereof. The one or more devices may include one or more voltmeters, ohmmeters, ammeters, light meters, the like, or a combination thereof. The one or more power sources, detection devices, or both may be in electrical communication with a computer readable storage medium. The computer readable storage medium may include a server, processor, memory, or a combination thereof. A user may initiate the testing unit, a software program within the storage medium may initiate the testing unit, or both. Initiation of the testing unit may initiate an electric circuit functionality test, illumination test, or both.

The testing unit may include one or more processors configured to execute the electric circuit functionality test, the illumination test, or both. One or more processors may access the software program to initiate the electric circuit functionality test, the illumination test, or both. The software program may be stored within one or more storage mediums part of the testing unit, in communication with the testing unit, or both. One or more servers, processors, storage mediums, and the like may be non-transient.

The salvage determination process may include an electric circuit functionality test. The electric circuit functionality test may function to determine if one or more components are salvageable, one or more individual circuits are performing at a predetermined level, or both. The electric circuit functionality test may be performed on one or more components, electrical circuits, or both individually, simultaneously, or both. By performing the electric circuit functionality test on individual circuits, the performance of individual components can be determined independent of the performance of other components. The electric circuit functionality test may be performed for an individual component by passing an electrical current to that component via a circuit associated with that component. The electric circuit functionality test may include detecting and measuring one or more features of the electrical current related to one or more components, circuits, or both. One or more features may include the current, resistance, voltage, the like, or a combination thereof. Detection and measuring may be completed by one or more detection devices of the testing unit. Upon detecting and measuring one or more features, one or more electrical feature values may be determined. The one or more electrical feature values may be compared to one or more predetermined values (e.g., "predetermined acceptable values"). The one or more predetermined values may include one or more predetermined ranges of the one or more electrical feature values. The one or more predetermined values may include a predetermined current range, a predetermined voltage range, a predetermined resistance range, the like, or a combination thereof. The one or more predetermined values may be determined by an automotive manufacturer, type of headlamp assembly and light source, the style of the headlamp assembly, the style of the vehicle, the type of vehicle, the like, or any combination thereof. The one or more predetermined values may be values from and/or measured by vehicle manufacturer specifications and requirements, including Federal Motor Vehicle Safety Standards (e.g., Federal Motor Vehicle Safety Standard No. 108 "FMVSS 108" for Lamps, reflective devices, and associated equipment, dated Oct. 1, 2004), Vehicle OEM Lamp Development and Validation Test Procedures (e.g., General Motors Vehicle Lamp Development and Validation Test Procedures, GM 14906, $10^{th}$ edition, January 2018), Canada Motor Vehicle Standards (e.g., Canada Motor Vehicle Standard 108 "CMVSS 108" for Lighting Systems and Reflective Devices, dated Jan. 30, 2015), Society of Automotive Engineers (SAE) performance requirements, and the like, incorporated herein by reference in their entirety. The one or more predetermined values may be the same or exceed those from when a lamp assembly is originally manufactured and installed. The one or more predetermined values may be those associated with a high beam, low beam, turn signal, position and/or park, daytime running lights, side markers, side reflex, the like, or any combination thereof. The one or more predetermined values may be values from and/or measured according to SAE specifications. SAE specifications may include J1383 (December 1996), J580 (December 1986), J579 (December 1984), J580 (December 1986), J579 (December 1984), J588 (November 1984), J1395 (April 1985), J222 (December 1970), J2087 (August 1991), J592E (July 1972), J594 (January 1977), various revisions thereof, the like, or any combination thereof. After the comparison of the measured value of a feature compared to the predetermined value of the feature, a pass or fail determination may be made. The pass or fail determination may be completed by an individual, automatically by the testing unit, or both. The pass or fail determination may determine that one or more components pass if their respective measured values of the features fall within the predetermined value ranges, fail if their respective measured values fall outside of the predetermined value ranges, or both. One or more components may pass the electrical circuit functionality test if their voltage falls within the predetermined voltage range, the resistance falls within the predetermined resistance range, the like, or a combination thereof. After, before, or simultaneous with the electrical circuit functionality test, an illumination test may occur. The electrical circuit functionality test may be partially or completely automated.

The salvage determination process may include an illumination test. The illumination test functions to determine if one or more lights are salvageable, one or more individual lights are performing at a predetermined level, or both. The illumination test may be performed on one or more lights individually, simultaneously, or both. By performing the light test on individual lights, the performance of each individual light can be determined independent of the performance of other lights. The light test may be performed for an individual light by passing an electrical current to that light via a circuit associated with that light. The light test may include detecting and measuring one or more features of the light. One or more features may include light output, the like, or a combination thereof. Light output may be measured in lumens. Detection and measuring may be completed by one or more detection devices of the testing unit. Upon detecting and measuring one or more features, the one or more light feature values may be determined. The one or more light feature values may be compared to one or more predetermined values (e.g., "predetermined acceptable values"). The one or more predetermined values may include one or more predetermined ranges of the one or more features. The one or more predetermined values may include a predetermined light output range. The one or more predetermined values may be determined by federal regulations, governmental agencies, professional organizations, automotive manufacturers, the like, or any combination thereof. For example, the Society of Automotive Engineers (SAE) International Lighting Standard Committee develops standards that reflect industry best practices. The one or more predetermined values may be those associated with a high beam, low beam, turn signal, position and/or park, daytime running lights, side markers, side reflex, the like, or any combination thereof. The one or more predetermined values may be measured according to SAE specifications. SAE specifications may include J1383 (December 1996), J580 (December 1986), J579 (December 1984), J580 (December 1986), J579 (December 1984), J588 (November 1984), J1395 (April 1985), J222 (December 1970), J2087 (August 1991), J592E (July 1972), J594 (January 1977), the like, or any combination thereof. After the comparison of the measured value of a feature compared to the predetermined value of the feature, a pass or fail determination may be made. The pass or fail determination may be completed by an individual, automatically by the testing unit, or both. The pass or fail determination may determine that one or more lights pass if their respective measured values of the features fall within the predetermined value ranges, fail if their respective measured values fall outside of the predetermined value ranges, or both. One or more lights may pass the illumination test if their light output falls within the predetermined light output range. After, before, or simultaneous with the illumination test, electrical circuit functionality test, or a visual inspection may occur. The illumination test may be partially or completed automated.

The salvage determination process may include a visual inspection. The visual inspection may function determine if one or more components of the lamp assembly have one or more visual flaws and/or defects. The visual inspection may occur before and/or during the salvaging process. The visual inspection may occur before, during, and/or after opening the lamp assembly. The visual inspection may apply to both electrically powered and non-powered components. To perform a visual inspection, each component may have a set of designated criteria to adhere to. An individual may inspect the component for meeting the designated criteria. Defects to inspect for may include dents, cracks, stress marks, loose electrical connections, poor soldering, the like, or a combination thereof.

The salvage determination process may include recording one or more features and/or feature values into a salvage test database. The salvage test database may function to track the one or more features, identify which components pass and/or fail the salvage determination process, or both. The database may be stored within a computer readable storage medium. The computer readable storage medium may be part of, in communication with, or both, the testing station. Upon detecting and measuring one or more features of one or more components, lights, or a combination thereof as part of the electric circuit functionality test, the illumination test, or both, one or more values associated with the one or more features may be transferred and stored in the one or more salvage test databases. One or more processors may convert one or more feature values into one or more field entries. One or more processors may transfer the one or more feature values to the one or more salvage test databases. The database may include a plurality of fields. The fields mays store the detected and measured values. The database may be organized into one or more arrays. The one or more arrays may be associated with one or more lamp assemblies, lights, electrical circuits, components, the like, or a combination thereof. The database may also include results from the electrical circuit functionality test, illumination test, visual inspection or a combination thereof.

Salvaging Process

The disclosure relates to a salvaging process. The salvaging process may be useful in salvaging or harvesting one or more components from a lamp assembly identified as salvageable. The salvaging process may include maintaining the lamp assembly in the testing station or moving the lamp assembly to a separate harvesting station. The testing station may be the same or different from the harvesting station. To begin the salvaging process, access to the interior of the lamp assembly is created. Access to the interior is provided by opening the lamp assembly.

The salvaging process may include opening the lamp assembly. Opening the lamp assembly may be useful for breaking the adhesive joint, mechanical joint, or both between an exterior lens and a housing. The method for opening a lamp assembly may include cutting about an adhesive joint, rim, periphery, mating rims, mating flanges, or a combination thereof between an exterior lens and a housing. Cutting may occur using a separation device. The separation device may be programmed in advance to follow the shape of the adhesive joint, rim, periphery, mating rims, mating flanges, or a combination thereof. After cutting the lamp assembly, the lamp assembly may be separated. Separation may include removal of the exterior lens from the housing, the housing from the exterior lens, or both. Upon separation, an interior of the housing and one or more components of the lamp assembly may be exposed.

The salvaging process may include removing one or more components. Removal of the components may allow for one or more components to be salvaged and reused, recycled, disposed of, or a combination thereof. The components may be removed before, during, and/or after opening the lamp assembly. One or more components may be removed manually, with one or more automated tools, or both. Components may be visually inspected after removal. Only components which have passed the electrical circuit functionality test and/or illumination test may be visually inspected. Components may be cleaned after removal. Only components which have passed the electrical circuit functionality test, illumination test and/or visual inspection may be cleaned. One or more components may be sorted, transferred to inventory, or both. Components which are transferred to inventory may be stored for subsequent use. Components transferred to inventory may only be those components which have passed the electrical functionality test, illumination test, and/or visual inspection. One or more components may be recycled, disposed of, or both. The one or more components which are recycled and/or disposed may be those components which failed the electrical circuit functionality test, illumination test, visual inspection, or a combination thereof Lamp Remanufacturing Process The disclosure further relates to a lamp remanufacturing process. The lamp remanufacturing process may be useful for assembling a lamp assembly using one or more salvaged components. The one or more salvaged components may be one or more components which were salvaged using the salvage determination process, salvage process, or both. The lamp remanufacturing process may be substantially useful in allowing for the reuse of lamp assembly components, reducing the cost of the lamp, reducing the environmental footprint associated with lamp manufacturing, providing a longer useful lifespan of one or more components of a lamp assembly, or a combination thereof.

The lamp remanufacturing process may begin with placement of a housing in an assembly station. The assembly station may be useful in retaining the one or more components during assembly. The assembly station may include one or more clamps to retain the housing in place while one or more components are being installed within the interior. After placement of the housing, one or more components are assembled into the housing. Component assembly may include securing, connecting, placing, the like, or a combination thereof. Component assembly may be completed manually, partially automated, or automated. One or more components assembled into the housing may include a projector assembly, shutter board, connector and wire harness, HID projector, projector trim ring, driver module, DRL assembly, running light LED reflector assembly, lower turn indicator, reflector cups, interior trim, side reflector, and/or a combination thereof.

The lamp remanufacturing process may include a light-up test. The light-up test may be useful in testing one or more components, the overall lamp assembly, or both for functionality. The light-up test may be similar to the electrical circuit functionality test, illumination test, or both. The light-up test may detect and measure voltage, resistance, current, light output, or a combination thereof of one or more components of the lamp assembly. The light-up test may utilize one or more detecting devices. One or more detecting devices may be part of the assembly station. If the assembly passes the light-up test, the housing and components may move on to a plasma treatment process.

The lamp remanufacturing process may include a pre-treatment process. The pre-treatment process may provide for better adhesion of one or more adhesives, a stronger bond between two or more components, or both. The pre-treatment may provide a cleaning effect, micro-etching effect, and/or functionalizing effect. The pre-treatment may discharge a stream of charged ions. The pre-treatment process may be or include an etching treatment. The etching treatment may be a plasma treatment. An exemplary plasma treatment may be Enercon's Blown Ion Series. The pre-treatment may be applied onto the same surface on which an adhesive may be applied. The pre-treatment may be applied to the housing, exterior lens, or both. The pre-treatment may be applied about a flange, rim, or both of the housing, exterior lens, or both. After the pre-treatment, one or more sealing processes may be completed. One or more sealing process may include one or more attachment methods. For example, after the pre-treatment (e.g., etching), an adhesive may be applied.

The lamp remanufacturing process may include one or more attachment methods. The one or more attachment methods may include one or more bonding methods, mechanical fasteners, adhesive materials, the like, or a combination thereof. The one or more attachment methods may function to semi-permanently, permanently bond one or more components, provide a seal about the lamp assembly, or both. An adhesive may be applied to the housing, exterior lens, or both. The adhesive may be applied about a flange, rim, or both of the housing, exterior lens, or both.

The lamp remanufacturing process may include a closure step. The closure step may function as the final assembly step, finalizing the lamp assembly, or both. In the closure step, the exterior lens may be placed and affixed to the housing or vice-versa. To affix the exterior lens to the housing, one or more adhesives, mechanical fasteners, or both may be used. To affix the exterior lens to the housing, a rim and/or flange of the exterior lens may be aligned with and mate to a rim and/or flange of the housing.

Illustrative Embodiments

FIG. 1 illustrates an exploded view of a lamp assembly 10. The lamp assembly 1 includes a housing 12. The housing 12 has a wire harness 14 affixed thereto to power one or more components. The wire harness 14 may connect the lamp assembly 10 to a power source (not shown) of a vehicle (not shown). The lamp assembly 10 includes an adjuster 16. Located within the housing 12 are two light assemblies 18. The two light assemblies 18 may be light sources, optics, or the like. The two light assemblies 18 may be light emitting diodes (LED). The housing 12 includes two light guides 20. The light guides 20 may be LED reflectors. Working in conjunction with the light assemblies 18 are lenses 22. Fitted to the housing 12 is an interior bezel 24. Also located within the housing 12 is a projector assembly 26. Enclosing the housing 12 is an exterior lens 28. Located about a portion of the housing 12 is an exterior bezel 30.

FIGS. 2A-2D illustrate a process of exposing the interior of a lamp assembly 10. By exposing an interior of the lamp assembly 10, one or more components of the lamp assembly 10 may be salvaged. A device 100 include a cutting mechanism 102. The device 100 is a robotic arm. The cutting mechanism 102 is a circular sawblade. The cutting mechanism 102 cuts about the housing 12 to separate the housing 12 from the exterior lens 28. After separation of the exterior lens 28, the interior of the lamp assembly 10 is able to be exposed and one or more components removed without being damaged.

Figure 3:
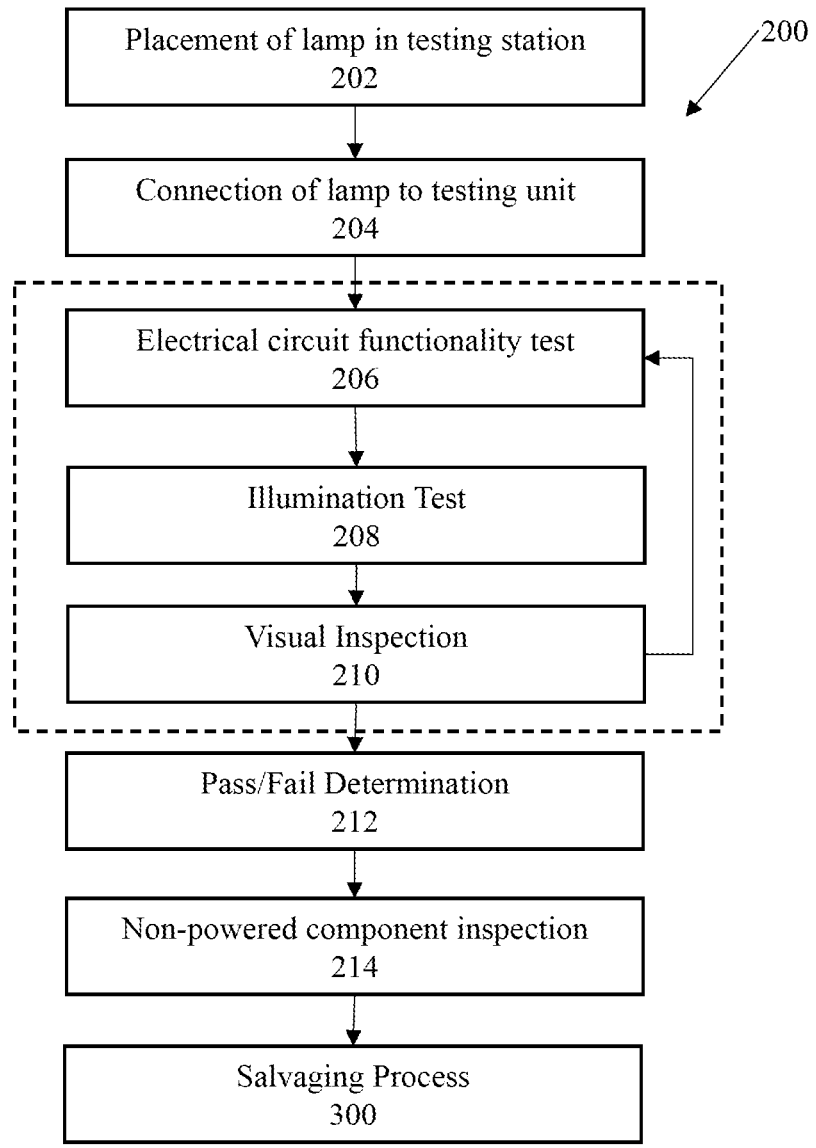
FIG. 3 illustrates a process flow of a salvage determination process.

FIG. 3 illustrates a process flow of a salvage determination process 200. The salvage determination process 200 determines what components in a lamp assembly 10 may be salvageable. The process 200 begins by placing the lamp assembly 10 within a testing station 202. After placement 202, the lamp assembly 10 is connected to a testing unit 204. After connection to the testing unit 204, an electrical circuit functionality test is performed 206. During the electrical circuit functionality test 206, each individual electrical circuit of the lamp assembly 10 has a current passed therethrough, one circuit at a time. As part of the test 206, the voltage and resistance measured in each individual circuit is recorded into a salvage test database 500 (not shown). If one of the lights of the lamp assembly is part of an individual circuit, an illumination test 208 is performed. When current is received by a light of the headlamp assembly 10 during the electrical functionality test 206, the light may be illuminated if functional. During the illumination test 208, a lumen reader verifies each individual light of the lamp assembly 10 is illuminated. During the illumination test 208, the lumen read detects the light level being emitted by each individual light. The light level, a status of the light level (e.g., above, at, or below a predetermined light level), or both may be recorded in the salvage test database 500. After the electrical functionality test 206 and illumination test 208, there is a visual inspection 210. The visual inspection 210 is performed by an individual. During the visual inspection 210, the individual visually inspects each component for any visual flaws or defects. After the visual inspection 210, there is a pass-fail determination 212. During the pass-fail determination 212, circuits are compared to predetermined voltage and resistance values and lights which are compared to predetermined light levels. During the pass-fail determination 212, the circuits (and associated components) which meet the predetermined values and do not have visual defects are identified as passing components and those that do not meet the predetermined values or have visual defects are determined as failing components. After the pass-fail determination 212, non-powered components are inspected 214. Those that have visual defects are identified as failing components and those without visual defects are identified as passing components. After the pass-fail determination 212 and non-powered component inspection 214, the headlamp 10 may transfer to a component salvaging process 300.

Figure 4:
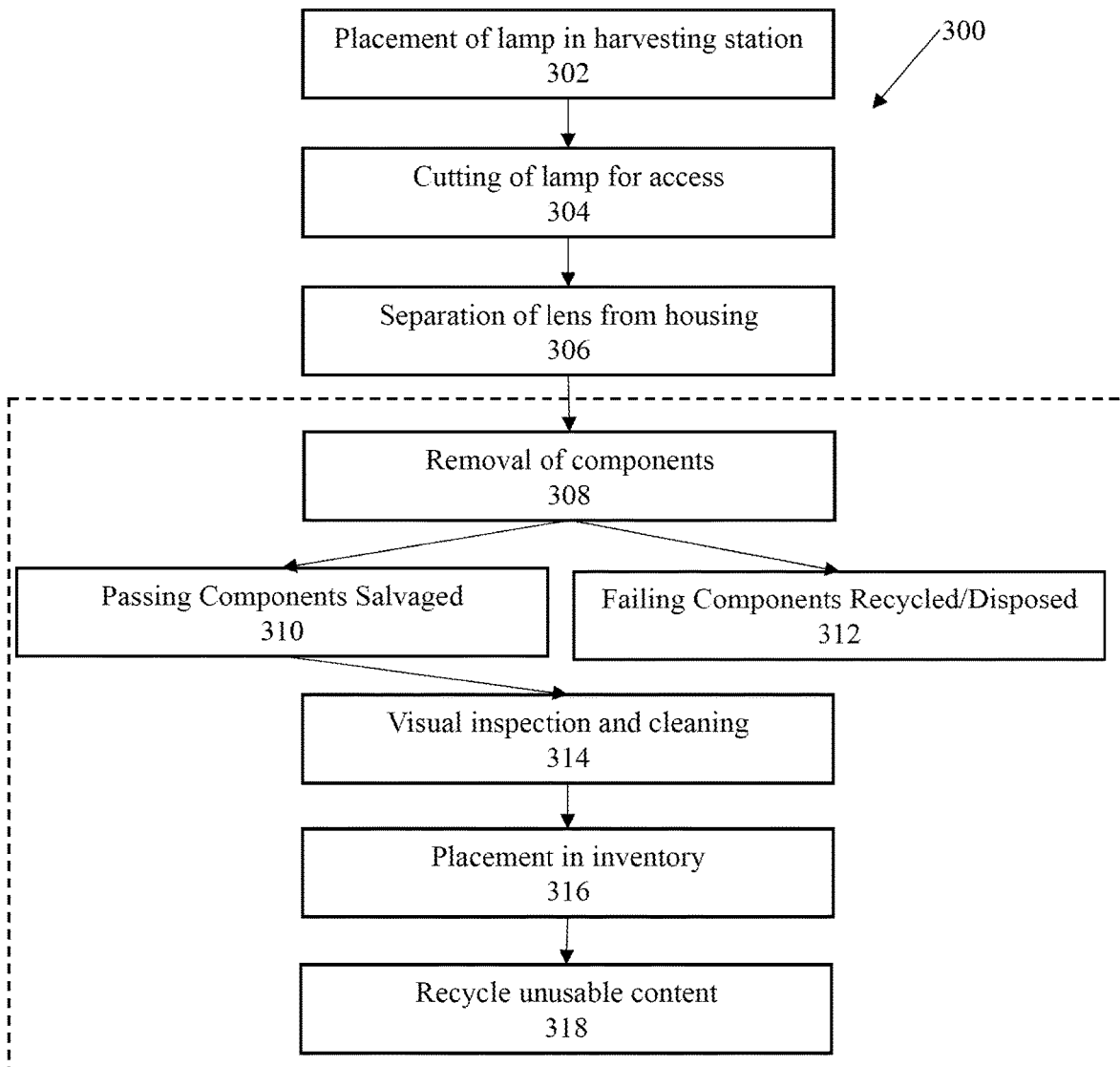
FIG. 4 illustrates a process flow a component salvaging process.

FIG. 4 illustrates a process flow of a component salvaging process 300. The salvaging process 300 begins with placement of a lamp assembly 10 in a harvesting station 302. After placement, a cutting of the lamp 304 is performed. The cutting step 304 may utilize a device 100 with a cutting mechanism 102 as illustrated in FIGS. 2A-D. During the cutting step 304, the device 100 may be programmed to the specific design of the headlamp assembly 10. By being programmed to the design of the headlamp assembly 10, the cutting mechanism 102 may follow the joint of the housing 12 to the exterior lens 28 as precisely as possible, allowing for minimal damage to either component and preventing damage to components within the housing 12. After the cutting step 304, the process 300 moves on to separation of the lens from the housing 306. During this step, the exterior lens 28 is removed from the housing 12, exposing an interior of the lamp assembly 10. After separation 306, the components within the housing 12 are removed 308. The components which were identified as passing the salvage determination process 200 are salvaged 310. Salvaging begins with the component(s) being visually inspected and cleaned 314. Those components which were identified as failing during the salvage determination process 200 are recycled or disposed 312. After inspection and cleaning 314, the passing components are placed in inventory 316. If the passing components include content which cannot be reused, that content is recycled 318.

Figure 5:
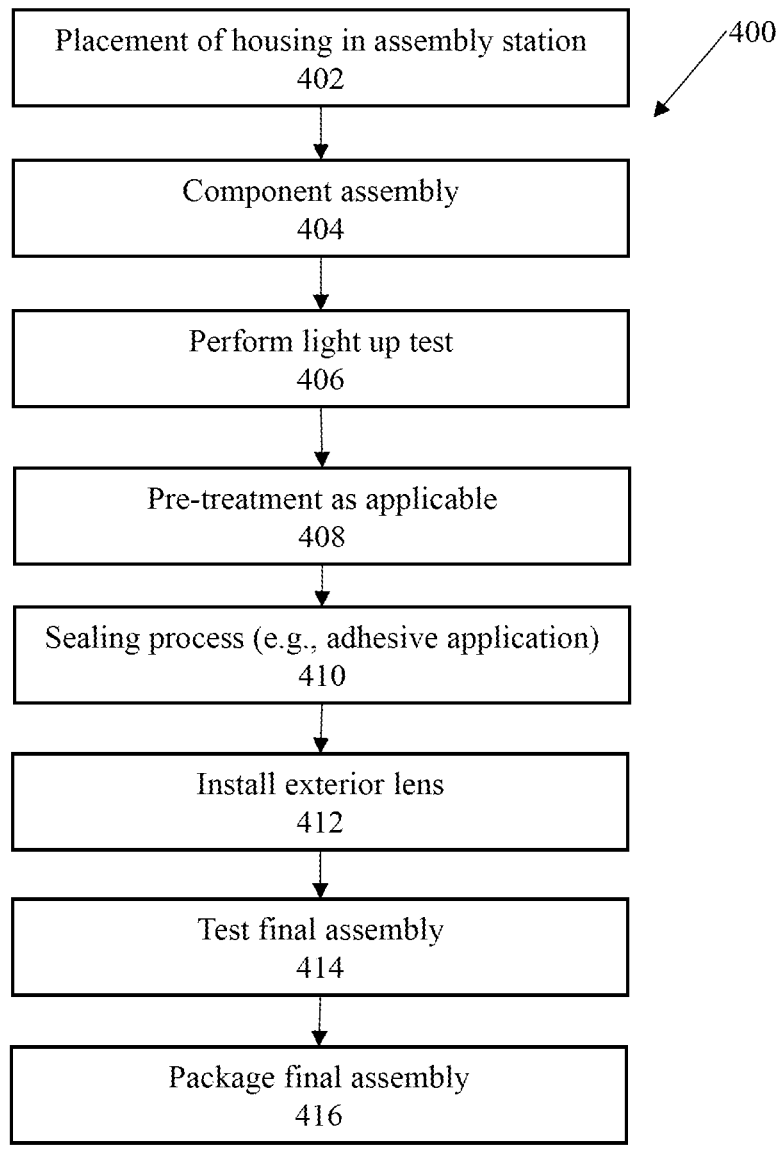
FIG. 5 illustrates a process flow of a lamp remanufacturing process.

FIG. 5 illustrates a process flow of a lamp remanufacturing process 400. The lamp remanufacturing process 400 is a process for assembling a lamp assembly 10 with one or more previously used (e.g., salvaged, harvested) components. The lamp remanufacturing process 400 begins with placement of a housing in an assembly station 402. After placement of the housing 402, component assembly 404 begins. Component assembly 404 may include install in, affixing to, the housing a projector assembly, shutter board, connector and wire harness, HID projector, projector trim ring, driver module, DRL assembly, running light LED reflector assembly, lower turn indicator, reflector cups, interior trim, side reflector and/or the like. After component assembly 404, a light up test is performed 406. During the light up test 406, voltage, resistance, and visual inspection is performed per individual headlamp specifications. If the light up test 406 is passed, the process 400 moves on to pre-treatment 408 if applicable. Pre-treatment 408 may include a plasma treatment. After pre-treatment 408 or directly after the light up test 406, the process 400 moves on to the sealing process 410. The sealing process 410 may include or be an adhesive application. During the adhesive application, adhesive is applied to the housing 12 along the surface to which an exterior lens 28 will be bonded and form a joint. After the sealing process 410, the exterior lens 28 is installed 412. After the exterior lens 28 is installed, the final lamp assembly 10 is tested 414. After testing, the final lamp assembly 10 is packaged for shipment 416.

Figure 6:
FIG. 6 illustrates a salvage test database.

FIG. 6 illustrates an exemplary salvage test database 500. The database 500 includes a plurality of fields 502 organized in arrays. Each array or row is associated with a lamp assembly 10. Values determines during the electric circuit functionality test 206 (not shown) and the illumination test 208 (not shown) may be recorded within the fields 502. The database 500 may also include results from pass/fail determination 212 (not shown) for each lamp assembly 10.

Reference Numbers: 10—Lamp assembly, 12—Housing, 14—Wire harness, 16—Adjuster, 18—Light assembly, 20—Light guide, 22—Lens, 24—Interior bezel, 26—Projector assembly, 28—Exterior lens, 30—Exterior bezel, 100—Device, 102—Cutting mechanism, 200—Salvage determination process, 202—Placement of lamp in testing station, 204—Connection of lamp to testing unit, 206—Electric circuit functionality test, 208—Illumination test, 210—Visual inspection, 212—Pass/Fail Determination, 214—Non-powered component inspection, 300—Salvaging process, 302—Placement of lamp in harvesting station, 304—Cutting of lamp, 306—Separation of lens from housing, 308—Removal of components, 310—Passing components salvaged, 312—Failing components recycled/disposed, 314—Visual inspection and cleaning, 316—Placement in inventory, 318—Recycle unusable content, 400—Lamp remanufacturing process, 402—Placement of lamp in assembly station, 404—Component assembly, 406—Perform light up test, 408—Plasma treatment, 410—Adhesive application, 412—Install exterior lens, 414—Test final assembly, 416—Package final assembly, 500—Salvage test database, 502—Fields.

Any numerical values recited in the above application include all values from the lower value to the upper value in increments of one unit provided that there is a separation of at least 2 units between any lower value and any higher value. These are only examples of what is specifically intended and all possible combinations of numerical values between the lowest value, and the highest value enumerated are to be considered to be expressly stated in this application in a similar manner. Unless otherwise stated, all ranges include both endpoints and all numbers between the endpoints.

The terms "generally" or "substantially" to describe angular measurements may mean about +/−10° or less, about +/−5° or less, or even about +/−1° or less. The terms "generally" or "substantially" to describe angular measurements may mean about +/−0.01° or greater, about +/−0.1° or greater, or even about +/−0.5° or greater. The terms "generally" or "substantially" to describe linear measurements, percentages, or ratios may mean about +/−10% or less, about +/−5% or less, or even about +/−1% or less. The terms "generally" or "substantially" to describe linear measurements, percentages, or ratios may mean about +/−0.01% or greater, about +/−0.1% or greater, or even about +/−0.5% or greater.

The term "consisting essentially of" to describe a combination shall include the elements, ingredients, components, or steps identified, and such other elements ingredients, components or steps that do not materially affect the basic and novel characteristics of the combination. The use of the terms "comprising" or "including" to describe combinations of elements, ingredients, components, or steps herein also contemplates embodiments that consist essentially of the elements, ingredients, components, or steps.

Plural elements, ingredients, components, or steps can be provided by a single integrated element, ingredient, component, or step. Alternatively, a single integrated element, ingredient, component, or step might be divided into separate plural elements, ingredients, components, or steps. The disclosure of "a" or "one" to describe an element, ingredient, component, or step is not intended to foreclose additional elements, ingredients, components, or steps.

What is claimed is:

1. A method for identifying and salvaging reusable components of a vehicle lamp assembly; wherein the vehicle lamp assembly includes an exterior lens, a housing a plurality of components, and one or more light sources; and wherein the method comprises:
   i) placing the vehicle lamp assembly in a lamp retainer of a testing station wherein the lamp retainer is a fixture configured to retain the vehicle lamp assembly;
   ii) electrically connecting the vehicle lamp assembly to a testing unit part of the testing station;
   iii) performing an electric circuit functionality test by the testing unit on each component of the plurality of components of the vehicle lamp assembly; wherein during the electric circuit functionality test, an electrical current is automatically passed to the each component of the plurality of components, wherein the electric circuit functionality test is performed on the each component of the plurality of components individually by passing the electrical current through each individual circuit associated with the each component;
   iv) performing an illumination test by the testing unit on each light source of the one or more light sources within the vehicle lamp assembly, wherein during the illumination test, the electrical current is automatically passed to the each light source of the one or more light sources;

automatically identifying by one or more processors of the testing unit which one or more components of the plurality of components and/or which of the one or more light sources pass the electric circuit functionality test;

vi) cutting about an adhesive joint between the exterior lens and the housing of the vehicle lamp assembly, wherein the adhesive joint bonded the exterior lens to the housing, wherein the cutting is performed by a separation device which is automated and programmed in advance to follow the adhesive joint of the vehicle lamp assembly, wherein the separation device includes a robotic arm and one or more cutting mechanisms, and wherein after the cutting, the exterior lens is no longer bonded to the housing by the adhesive joint;

vii) separating the exterior lens from the housing to expose an interior of the vehicle lamp assembly, wherein the separating is performed after the cutting; and vii) removing the one or more components, the one or more light sources, or both which passed the electric circuit functionality test, the illumination test, or both such that they are reusable in another lamp assembly.

2. The method of claim 1, wherein the method includes removing the vehicle lamp assembly from a vehicle prior to placing the vehicle lamp assembly in the testing station.

3. The method of claim 1, wherein the electrical current is passed through the each individual circuit in a subsequent fashion or simultaneously.

4. The method of claim 3, wherein the illumination test is performed on the each light source individually.

5. The method of claim 4, wherein the illumination test is performed on the each light source in a subsequent fashion or simultaneously.

6. The method of claim 5, wherein the illumination test is performed on the each light source individually by passing the electrical current through an individual circuit associated with the each light source.

7. The method of claim 4, wherein one or more features of performance of the one or more light sources are detected and measured for the each light source resulting in one or more light feature values; and
   wherein the one or more features of performance include a light output.

8. The method of claim 7, wherein a determination if the one or more light sources passes and/or fails the illumination test is based on comparing the one or more light feature values with one or more predetermined acceptable values;
   wherein the one or more predetermined acceptable values include a predetermined light output range; and
   wherein the one or more light sources passes the illumination test if the light output falls within the predetermined light output range.

9. The method of claim 1, wherein the illumination test is executed after the electric circuit functionality test.

10. The method of claim 1, wherein one or more features of the electrical current are automatically detected and measured for the each individual circuit resulting in one or more electrical feature values; and
   wherein the one or more features of the electrical current include a resistance, a voltage, or a combination thereof.

11. The method of claim 10, wherein the identifying of which of the one or more components pass and/or fail the electric circuit functionality test is based on comparing the one or more electrical feature values with one or more predetermined acceptable values;
   wherein the one or more predetermined acceptable values include a predetermined voltage range, a predetermined resistance range, or a combination thereof; and
   wherein the one or more components pass the electric circuit functionality test if an electrical feature value associated with the voltage falls within the predetermined voltage range, an electrical feature value associated with the resistance falls within the predetermined resistance range, or a combination thereof.

12. The method of claim 1, wherein the testing unit is adapted to automatically perform the electric circuit functionality test, the illumination test, or both;
   wherein the testing station includes the one or more processors for automatically executing the electric circuit functionality test, the illumination test, or both;
   wherein the testing unit includes one or more sensing devices configured to sense one or more electrical features for the electric circuit functionality test, one or more light features for the illumination test, or both; and
   wherein the testing station is in communication with a computer readable storage medium having one or more salvage test databases stored therein.

13. The method of claim 12, wherein upon detecting and measuring one or more features of the one or more components, the one or more light sources, or a combination thereof as part of the electric circuit functionality test, the illumination test, or both, one or more values associated with measurements of the one or more features are transferred and stored in the one or more salvage test databases.

14. The method of claim 1, wherein the one or more cutting mechanisms includes a circular saw blade, a laser, a water jet, a router, a hot knife, or a combination thereof.

15. The method of claim 1 further comprising assembling a remanufactured lamp assembly with the one or more components and/or the one or more light sources identified as passing, the method comprising:
   i) assembling the one or more components, the one or more light sources, or both previously part of the vehicle lamp assembly into a housing of the remanufactured lamp assembly, wherein the one or more components and/or the one or more light sources passed the electric circuit functionality test, the illumination test, a visual inspection, or a combination thereof;
   ii) performing a functionality test on the one or more components and/or the one or more light sources; and
   iii) affixing an exterior lens of the remanufactured lamp assembly to the housing to form the remanufactured lamp assembly.

16. A method for identifying, salvaging, and reusing reusable components of a vehicle lamp assembly; wherein the vehicle lamp assembly includes an exterior lens, a housing, a plurality of components, and one or more light sources; and wherein the method comprises:
   i) placing the vehicle lamp assembly in a lamp retainer of a testing station, wherein the lamp retainer is a fixture configured to retain the vehicle lamp assembly;
   ii) electrically connecting the vehicle lamp assembly to a testing unit part of the testing station;
   iii) performing an electric circuit functionality test by the testing unit on each component of the plurality of components of the vehicle lamp assembly; wherein during the electric circuit functionality test, an electrical current is automatically passed to the each component of the plurality of components, wherein the electric circuit functionality test is performed on the each component of the plurality of components individually by passing the electrical current through each individual circuit associated with the each component;

iv) performing an illumination test by the testing unit on each light source of the one or more light sources within the vehicle lamp assembly, wherein during the illumination test, the electrical current is automatically passed to the each light source of the one or more light sources;

v) automatically identifying by one or more processors of the testing unit which one or more components of the plurality of components and/or which of the one or more light sources pass the electric circuit functionality test;

vi) cutting about an adhesive joint between the exterior lens and the housing of the vehicle assembly lamp, wherein the adhesive joint bonded the exterior lens to the housing, wherein the cutting is performed by a separation device which is automated and programmed in advance to follow the adhesive joint of the vehicle lamp assembly, wherein the separation device includes a robotic arm and one or more cutting mechanisms, and wherein after the cutting, the exterior lens is no longer bonded to the housing by the adhesive joint;

vii) separating the exterior lens from the housing to expose an interior of the vehicle lamp assembly, wherein the separating is performed after the cutting;

viii) removing the one or more components, the one or more light sources, or both which passed the electric circuit functionality test, the illumination test, or both; and ix) assembling a remanufactured lamp assembly with the one or more components and/or the one or more light sources identified as passing and removed from the vehicle lamp assembly.

17. The method of claim 16, wherein the method includes removing the vehicle lamp assembly from a vehicle prior to placing the vehicle lamp assembly in the testing station.

18. The method of claim 17, wherein the electrical current is passed through the each individual circuit in a subsequent fashion or simultaneously; and wherein the illumination test is executed after the electric circuit functionality test.

19. The method of claim 18, wherein one or more features of the electrical current are automatically detected and measured for the each individual circuit resulting in one or more electrical feature values; and wherein the one or more features of the electrical current include a resistance, a voltage, or a combination thereof.

20. The method of claim 19, wherein the identifying of which of the one or more components pass and/or fail the electric circuit functionality test is based on comparing the one or more electrical feature values with one or more predetermined acceptable values;

wherein the one or more predetermined acceptable values include a predetermined voltage range, a predetermined resistance range, or a combination thereof; and wherein the one or more components pass the electric circuit functionality test if an electrical feature value associated with the voltage falls within the predetermined voltage range, an electrical feature value associated with the resistance falls within the predetermined resistance range, or a combination thereof.

* * * * *